United States Patent
Lyons, Jr. et al.

(10) Patent No.: US 9,619,598 B2
(45) Date of Patent: Apr. 11, 2017

(54) INPUT SPACE REDUCTION FOR VERIFICATION TEST SET GENERATION

(71) Applicant: Mentor Graphics Corporation, Wilsonville, OR (US)

(72) Inventors: Clifton A. Lyons, Jr., Lake Oswego, OR (US); Sudhir D. Kadkade, Lake Oswego, OR (US); Kunal P. Ganeshpure, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/755,639

(22) Filed: Jan. 31, 2013

(65) Prior Publication Data

US 2014/0013290 A1    Jan. 9, 2014

Related U.S. Application Data

(60) Provisional application No. 61/641,222, filed on May 1, 2012, provisional application No. 61/632,830, filed on Jan. 31, 2012.

(51) Int. Cl.
  *G06F 9/455* (2006.01)
  *G06F 17/50* (2006.01)
  *G06F 11/263* (2006.01)

(52) U.S. Cl.
  CPC ........ *G06F 17/5045* (2013.01); *G06F 11/263* (2013.01)

(58) Field of Classification Search
  USPC ........................................................ 716/106
  See application file for complete search history.

(56) References Cited

U.S. PATENT DOCUMENTS

| | | | |
|---|---|---|---|
| 2003/0200244 A1 | 10/2003 | Abraham et al. | |
| 2004/0199887 A1* | 10/2004 | Jain et al. | 716/5 |
| 2005/0021486 A1* | 1/2005 | Naveh | 706/46 |

(Continued)

OTHER PUBLICATIONS

Clark Barrett and Cesare Tinelli. CVC3. In Werner Damm and Holger Hermanns, editors, Proceedings of the 19th International Conference on Computer Aided Verification (CAV'07), vol. 4590 of Lecture Notes in Computer Science, pp. 298-302. Springer-Verlag, Jul. 2007. Berlin, Germany.

(Continued)

*Primary Examiner* — Eric Lee
(74) *Attorney, Agent, or Firm* — Banner & Witcoff, Ltd.

(57) ABSTRACT

Various implementations of the invention provide for the determination of a test set that satisfies a coverage model, where portions of the search space need not be searched in order to generate the test set. With various implementations of the invention, a search space defined by a set of inputs for an electronic design and a coverage model is identified. The search space is then fractured into subspaces. Subsequently, the subspaces are solved to determine if they include at least one input sequence that satisfies the coverage constraints defined in the coverage model. The subspaces found to include at least one input sequence that satisfies these coverage constraints, are then searched for unique input sequences in order to generate a test set. Subspaces found not to include at least one input sequence that satisfies the coverage constraints may be excluded from the overall search space.

20 Claims, 8 Drawing Sheets

(56) References Cited

U.S. PATENT DOCUMENTS

2008/0072190 A1* 3/2008 Jain et al. .................. 716/5

OTHER PUBLICATIONS

Non-final Office Action issued in U.S. Appl. No. 13/875,143 mailed Jan. 7, 2014.
Final Office Action recevied in U.S. Appl. No. 13/875,143, mailed on Jul. 30, 2014.
Platzner et al., "Design and Implementation of a Parallel Constraint Satisfaction Algorithm". Technical Report 96/04. Aug. 1996.

* cited by examiner

INPUT SPACE REDUCTION FOR VERIFICATION TEST SET GENERATION

CROSS REFERENCE TO RELATED APPLICATIONS

This application claims priority to provisional application No. 61/641,222, filed on May 1, 2012, having the same title, and claims priority to provisional application No. 61/632,830, filed Jan. 31, 2012, and having the title "Search Space Reduction for Coverage Based Verification Test Set Generation," each of which is hereby incorporated by reference in its entirety for all purposes.

FIELD OF THE INVENTION

The present invention is directed towards the verification of electronic designs. More specifically, various implementations of the invention are applicable to generating test sets, which satisfy specified verification criteria.

BACKGROUND OF THE INVENTION

Electronic devices are used in a variety of products, from personal computers to automobiles to toys. There are various different types of electronic devices, such as, for example, an integrated circuit. Furthermore, as those of skill in the art will appreciate, electronic devices can be connected, to form other electronic devices or systems. The designing and fabricating of electronic devices typically involves many steps, sometimes referred to as the "design flow." The particular steps of a design flow often are dependent upon the type of electronic device, its complexity, the design team, and the fabricator that will manufacture the device.

Several steps are common to most design flows. Initially, the specification for a new design is expressed, often in an abstract form and then transformed into lower and lower abstraction levels until the design is ultimately ready for manufacture. The process of transforming the design from one level of abstraction to another is referred to as synthesis. At several stages of the design flow, for example, after each synthesis process, the design is verified. Verification aids in the discovery of errors in the design, and allows the designers and engineers to correct or otherwise improve the design. The various synthesis and verification processes are facilitated by electronic design automation (EDA) tools.

As those of ordinary skill in the art will appreciate, the synthesis and verification processes applied to modern designs are quite complex and include many different steps. An illustrative design flow, for an integrated circuit, for example, can start with a specification for the integrated circuit being expressed in a high-level programming language, such as, for example, C++. This level of abstraction is often referred to as the algorithmic level. At this abstraction level, the functionality of the design is described in terms of the functional behavior applied to specified inputs to generate outputs. The design will then be synthesized into a lower level of abstraction, typically, the logic level of abstraction. At this level of abstraction, the design is expressed in a hardware description language (HDL) such as Verilog, where the circuit is described in terms of both the exchange of signals between hardware registers and the logical operations that are performed on those signals. At this stage, verification is often performed to confirm the functional behavior of the design, i.e. that the logical design conforms to the algorithmic specification.

After the logical design is verified, it is synthesized into a device design. The device design, which is typically in the form of a schematic or netlist, describes the specific electronic components (such as transistors, resistors, and capacitors) that will be used in the circuit, along with their interconnections. This device design generally corresponds to the level of representation displayed in conventional circuit diagrams. Verification is again performed at this stage in order to confirm that the device design conforms to the logical design, and as a result, the algorithmic specification.

Once the components and their interconnections are established, as represented by the device design, the design is again synthesized, this time into a physical design that describes specific geometric elements. The geometric elements define the shapes that will be created in various layers of material to manufacture the circuit. This type of design often is referred to as a "layout" design. The layout design is then used as a template to manufacture the integrated circuit. Verification is again performed, to ensure that the layout design conforms to the device design.

Although there are different methods of performing verification, this invention is directed towards verification processes that "exercise" a design by applying input to the design and capturing the output resulting from application of the input. The applied input is often referred to as an input vector. The captured output then is compared to the output the design should have produced according to the input vector and the specification. Various technologies exist for exercising a design, for example, the response (i.e. the output) of the design to the input vector, may be simulated. In some cases the output may be captured from an emulator, emulating the design with the input vector as stimulus for the emulation. A prototype may also be used to generate the output. Those of ordinary skill in the art will appreciate that combinations of simulation, emulation, and prototyping could be used during verification and that various combinations of technologies can be employed to implement a verification system as described here.

Verification typically consists of applying multiple input vectors (where an input vector is a tuple of values for input variables,) referred to as the test set and capturing each resulting output, referred to as the output set. The individual outputs from the output set then are compared to the corresponding expected outputs. There are many ways to generate the input vectors to include in a test set. For example, directed tests, that is, where the input vectors are directly specified by a designer can be employed. Random combinations of inputs can also be selected and used to form input vectors. Although ideally one would generate a test set that corresponds to all possible input combinations. The set of all possible input vectors to a modern electronic design is so large however, that it is not computationally feasible to exhaustively test the design in this manner. As a result, another approach to generating input vectors for verification is often used.

As those of ordinary skill in the art will appreciate, each input variable has a domain. The domain specifies the set of possible values that may be applied to the input corresponding to the domain. Usually there are constraints which restrict the combinations of input values which may be used to generate an input vector. These constraints may include legality constraints (e.g., which are typically derived from the design's operating specification), apparatus constraints (e.g., which are typically derived from the specifications of the equipment used to exercise the design), and/or coverage constraints (e.g., which are often derived from a verification plan). Those of ordinary skill in the art will appreciate that other types of constraints may also be used to limit or restrict the input values which may be used to generate input vectors.

The process of finding a tuple of values which satisfies a set of constraints is often referred to as "constraint solving". The process of finding a set of tuples of values, within which every tuple satisfies a set of constraints, is sometimes referred to as "constraint exploration".

Conceptually, to find a solution (or a set of solutions) to a constraint set, one could iterate through the set of possible value tuples (i.e. the cross products of the domains of the variables) and test each tuple against the constraints, selecting only those which satisfy every constraint, until the desired number of solutions is found. In practice, for modern electronic devices, the size of the set of possible value tuples (sometimes referred to as the "input space") is so large and the fraction of acceptable tuples is so small that the iteration approach is not practical. Instead, computational techniques such as satisfiability analysis are used to locate acceptable tuples within the input space. Those of ordinary skill in the art will appreciate that such computational techniques generally run considerably faster if the size of the input space can be reduced. Therefore, methods which can identify solution-free regions of an input space that can be pruned without affecting the verification results are of considerable interest.

Example embodiments of the disclosure discuss methods and techniques for pruning the input space as indicated above. Although such discussion is generally made with reference to coverage constraints, those of ordinary skill in the art will appreciate that other types of constraints may be used without departing from the spirit and scope of the invention.

BRIEF SUMMARY OF THE INVENTION

Various implementations of the invention provide for the determination of a test set that satisfies a coverage model, where portions of the input space need not be searched in order to generate the test set.

With various implementations of the invention, an input space defined by a set of inputs for an electronic design and a coverage model is identified. The input space is then fractured into subspaces. Subsequently, the subspaces are solved to determine if they include at least one input vector that satisfies the coverage constraints defined in the coverage model. The subspaces found to include at least one input vector that satisfies these coverage constraints, are then searched for unique input vectors to include in the test set. Subspaces found not to include at least one input vector that satisfies the coverage constraints, then may not be searched.

In various implementations of the invention, operation of the methods and techniques disclosed herein may be repeatable. More particularly, given the same input space and coverage constraints, the results will be reproducible over multiple iterations of the methods detailed herein. Furthermore, the results may be reproducible using different ones of the methods detailed herein.

In various implementations of the invention, the search of a particular subspace for unique input vectors will be initiated while the subspace is being solved as stated above. If it is determined by the solver that no solutions exist, then the search of the subspace will be aborted. With some implementations, multiple different solvers will be used to solve a subspace simultaneously. As soon as one of the solvers determines that no solution exists, the search of the subspace by all solvers may be aborted.

These and additional implementations of invention will be further understood from the following detailed disclosure of illustrative embodiments.

BRIEF DESCRIPTION OF THE DRAWINGS

The present invention will be described by way of illustrative implementations shown in the accompanying drawings in which like references denote similar elements, and in which.

DETAILED DESCRIPTION OF THE INVENTION

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "generate" to describe the disclosed implementations. Such terms are often high-level abstractions of the actual operations that are performed. The actual operations that correspond to these terms will often vary depending on the particular implementation.

Illustrative Operating Environment

Figure 1:
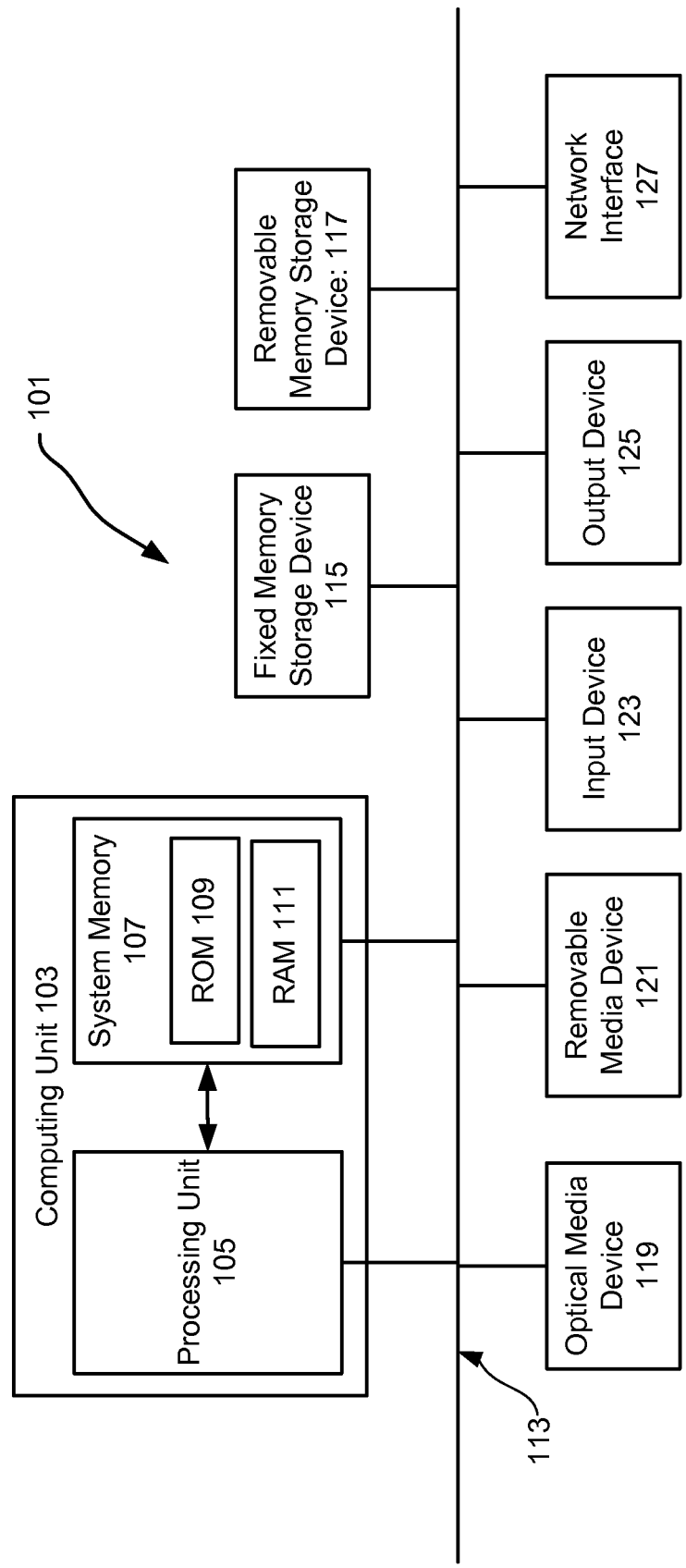
FIG. 1 illustrates a computing device.

As the techniques of the present invention may be implemented using computer executable instructions, the components and operation of a programmable computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory ("ROM") 109 and a random access memory ("RAM") 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-127 may be internally housed with the computing unit 103. Alternately, one or more of the peripheral devices 115-127 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

As stated above, various embodiments of the invention may be implemented using a programmable computer system executing software instructions, a computer readable medium having computer-executable software instructions stored thereon, or some combination thereof. Particularly, these software instructions may be stored on one or more computer readable media or devices, such as, for example, the system memory 107, or an optical disk for use in the optical media device 119. As those of ordinary skill in the art will appreciate, software instructions stored in the manner described herein are inherently non-transitory in nature. More specifically, the software instructions are available for execution by the computer system 101, as opposed to being transmitted to the computer system via a carrier wave or some other transitory signal.

Coverage Based Verification

Figure 2:
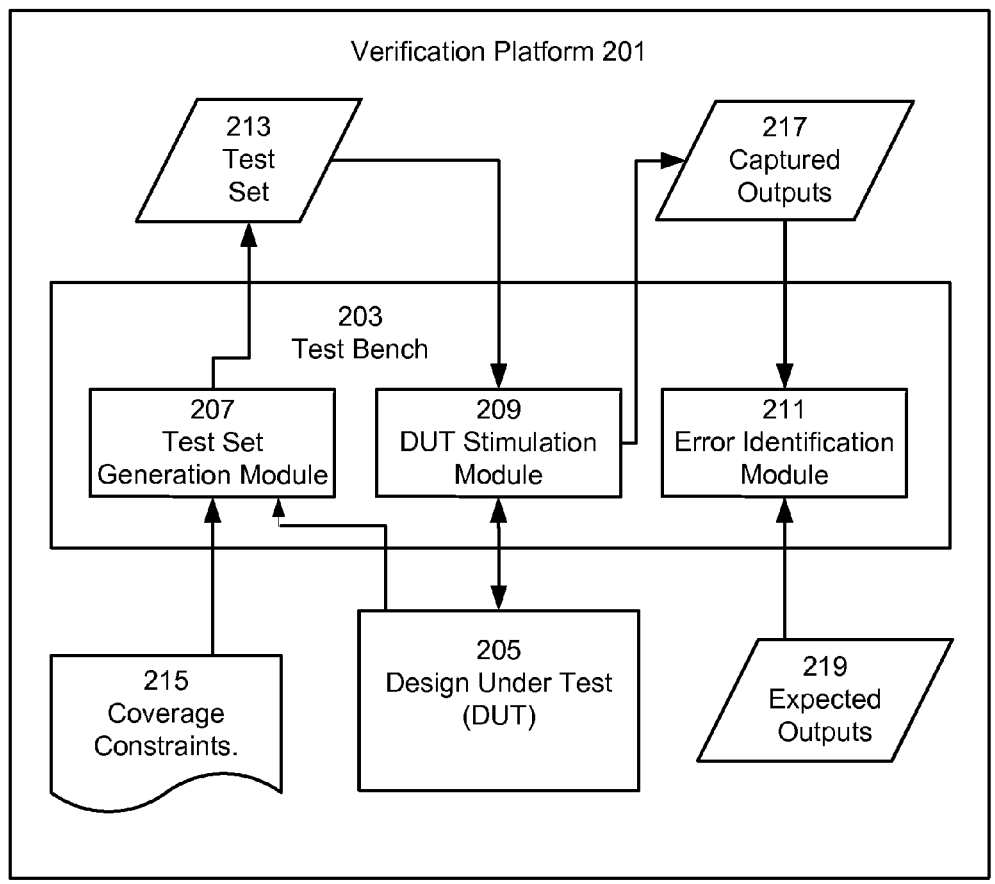
FIG. 2 illustrates a verification platform.
Figure 3:
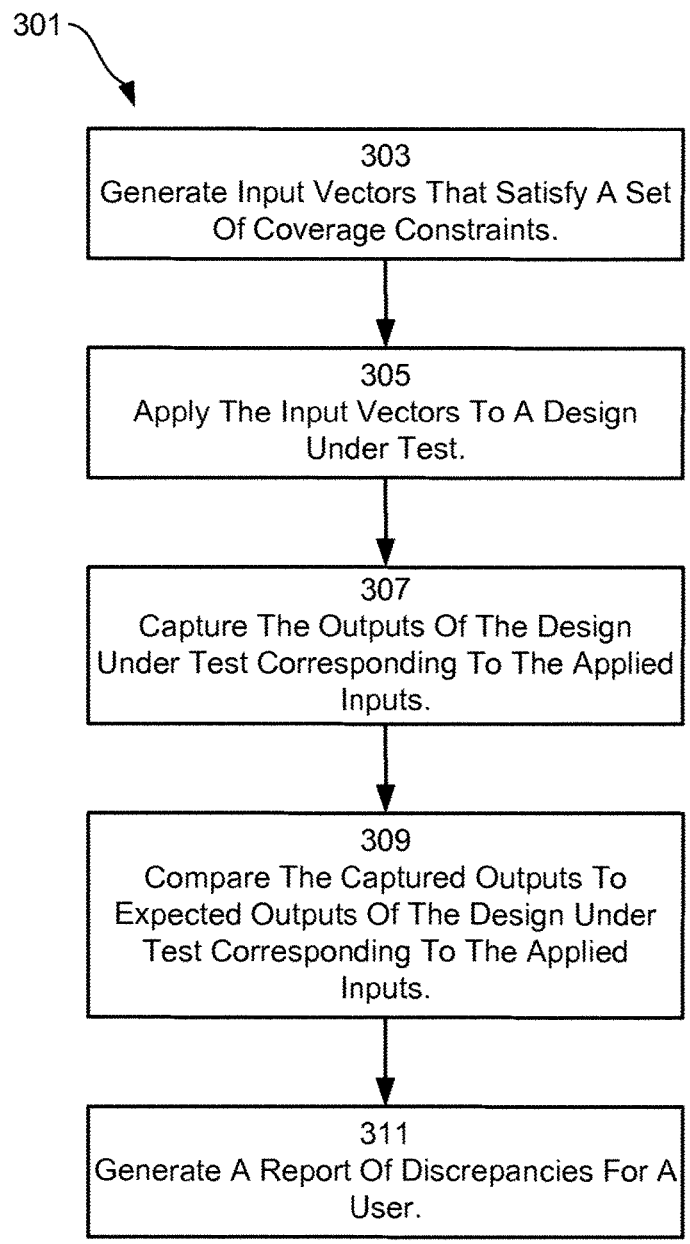
FIG. 3 illustrates a method of performing verification.

As detailed above, various implementations of the invention provide methods and apparatuses for generating a test set to be used for verifying an electronic design. Specifically, the test set may be generated without the need to search all portions of an input space defined by the potential inputs to the electronic design for unique input vectors that satisfy the coverage model. FIGS. 2 and 3 illustrate a verification platform 201 and a method 301 of performing verification that may be provided by various implementations of the present invention.

As can be seen from FIG. 2, the verification platform 201 includes a test bench 203 and a design under test (DUT) 205. With various instances of the invention, the DUT 205 will be implemented by an electronic design simulator, such as, for example, the Questa simulator available from Mentor Graphics Corporation of Wilsonville, Oreg. In some instances, the DUT 205 will be implemented by an electronic design emulator, such as, for example, the Veloce emulator available from Mentor Graphics Corporation of Wilsonville, Oreg. In various instances, the DUT 205 will be implemented by a prototype of the electronic design for which the DUT 205 represents. Still, with some implementations of the invention, combinations of these different embodiments may be used. For the balance of this disclosure however, it is assumed for purposes of clarity that the DUT 205 is implemented in a simulator.

In some implementations, the DUT 205 may be a software program. As those of ordinary skill in the art will appreciate, software programs are also verified during development. This verification process shares similarities to the hardware verification process detailed above. For example, a software program will have a set of valid inputs (e.g., button press, menu selection, key input, etc.). Furthermore, the software program may have a set of inputs with which the designer is particularly interested in testing. As such, coverage constraints may be specified for the software program, and then various embodiments of the present disclosure may be implemented to determine a test set for the software program as detailed herein.

The test bench 203 includes a test set generation module 207 configured to derive a set of input vectors (i.e. the test set 213) for the DUT 205 that satisfy a set of coverage constraints 215. The derivation of input vectors by the test set generation module 207 will be discussed in greater detail below. The test bench 203 further includes a DUT stimulation module 209 configured to apply the input vectors from the test set 213 to the DUT 205. The DUT stimulation module 209 is also configured to capture the responses of the DUT 205 as it is simulated with the test set 213 as input. These captured responses are referred to as the captured outputs 217. Additionally, an error identification module 211 is provided, which is configured to compare the captured outputs 217 to a set of expected outputs 219. The error identification module 211 is further configured to identify any discrepancies in the comparison and report them as potential errors in the DUT 205.

As can be further seen from FIG. 2, the test set generation module 207 may, in some implementations, generate tests based on the state of the DUT 205. For examples, during a verification process, the state of the DUT 205 will change in response to various factors (e.g., inputs applied, etc.). As such, the test set generation module 207 may account for these changing states in generating inputs to include in the test set 213.

As stated, FIG. 3 shows the method 301, which may be applied using the verification platform described above. As can be seen from this figure, the method 301 includes an operation 303 for generating the test set 213, that is, for generating input vectors that satisfy the coverage constraints 213. An operation 305 for applying the test set 213 to the DUT 205 and an operation 307 for recording the captured outputs 217 is also provided. An operation for comparing the captured outputs 217 to the expected outputs 219 and an operation 311 for generating a report of any discrepancies from this comparison are then provided.

Coverage Based Input Set Generation

As stated, various implementations of the invention provide methods and apparatuses for generating a test set to be used for verifying an electronic design. Particularly, for generating the test set without the need to search all portions of an input space defined by the potential inputs to the electronic design. Furthermore, the test set generation module 207 may be configured to generate the test set 213 in this manner, such as, for example, by application of the operation 303.

As those of ordinary skill in the art will appreciate, a typical electronic design, which the DUT 205 may represent, will have multiple input ports, with multiple different inputs allowed per port. For discussion purposes, each input port may be represented by an input variable, where each input variable may have multiple possible values. For example, the DUT 205 may represent an electronic design with 5 input ports where each input is binary. Representing the input ports as variables a-e, the set of all possible inputs for the DUT 205 may then be represented as the set of all possible combinations of (a, b, c, d, e) where the variable values are either logic 0 or logic 1. Each input combination (e.g. [0, 0, 0, 0, 1]) is referred to here as an input vector. The set of all possible input vectors then is referred to as the input space. For this simple example, there are only 32 different input combinations, that is, there are 32 unique input vectors in the input space. However, if the variable values were allowed to be anything between 0 and 9, then the possible combinations increase to 100,000. For a design where there are 20 input ports and 10 possible input values per port, there are over $10^{20}$ potential input combinations.

Modern electronic designs include hundreds of input ports, with many different combinations of potential input values per port. As such, it is not practical to derive and then test all possible unique input vectors in a verification process. In order to reduce the number of inputs needed to test a design, input ports, input values, and combinations of input ports and values that exercise particular functionality are identified. The input space is then restricted based on these identified input ports and input values. This is done by writing a set of constraints that restricts the values that each input variable can take on. More particularly, given the example above, where there are 5 possible inputs, represented by variables a-e, and where the possible input values are allowed to be an integer value between 0 and 9, the input space may be restricted by the constraint that the input variable a only be allowed to take on values of (1, 2, 3, 4, 5). Accordingly, the input space is now "restricted" based on this constraint, referred to herein as the coverage constraint, and the number of unique input vectors that satisfy this constraint is less than the total number of unique input vectors in the entire input space.

The operation 303 of FIG. 3 then derives the unique input vectors within the input space that satisfy the coverage constraints. Similarly, the test set generation module 207 of FIG. 2 is configured to determine the unique input vectors within the input space that satisfy the coverage constraints. As stated, these unique input vectors form the test set 213.

Figure 4:
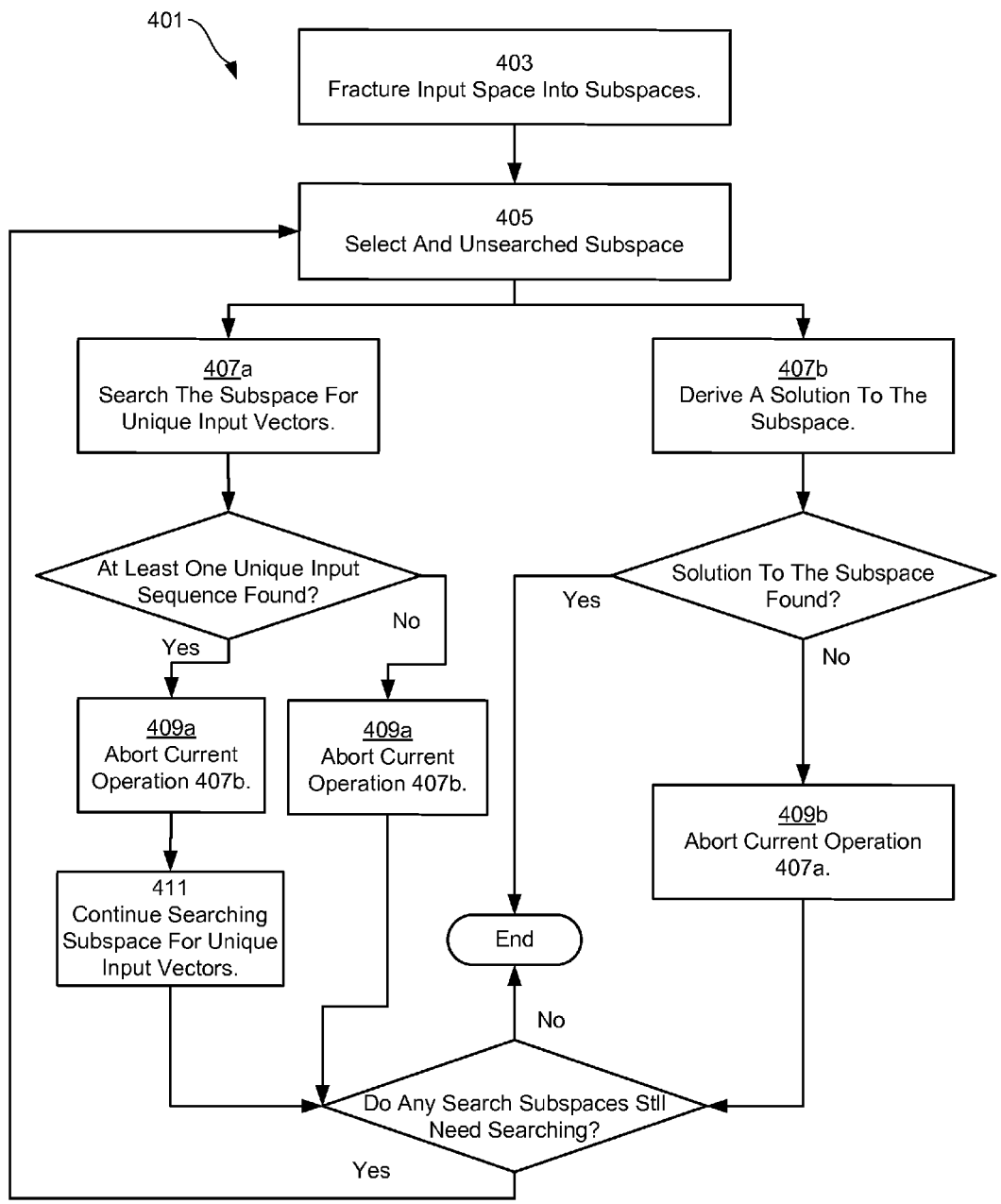
FIG. 4 illustrates a method of generating a test set.
Figure 5:
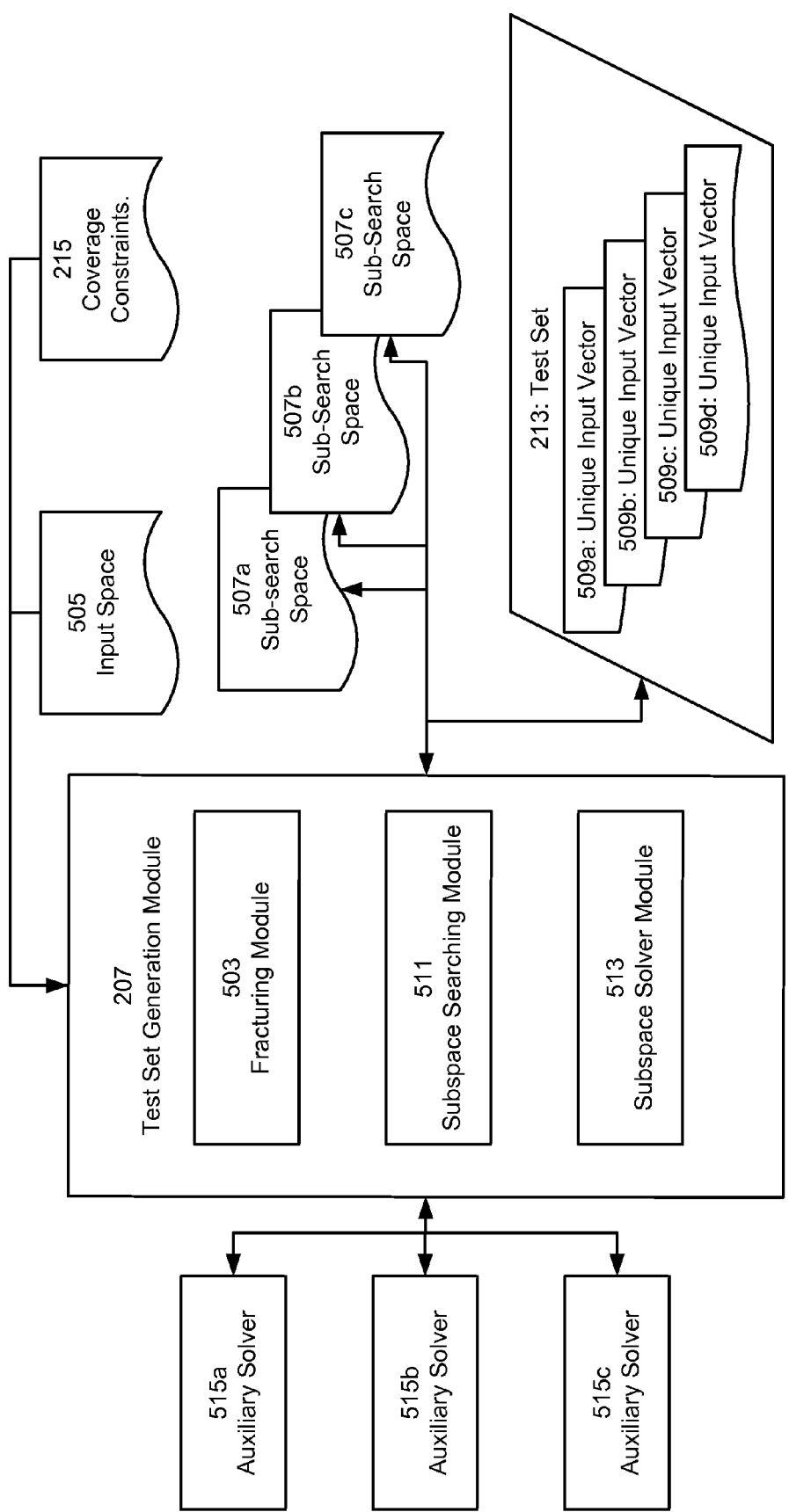
FIG. 5 illustrates component of the verification platform of FIG. 2 in greater detail.

FIG. 4 illustrates a method 401 that may be provided by various implementations of the present invention to identify these unique input vectors in a search space defined by the coverage constraints 215 and the DUT 205. FIG. 5 illustrates the test set generation module 207 in greater detail. As can be seen, the test set generation module 207 includes an input space fracturing module 503. FIG. 5 shows an input space 505, which corresponds to the inputs and possible input value of the DUT 205. Accordingly, the input space fracturing module 503 may be configured to split the search space 505 into subspaces 507.

The method 401 includes an operation 403 for fracturing the input space 505 into the sub spaces 507. With various implementations, the search space is fractured by input variables. Using the system and constraints described above, with inputs a-e having possible values 0-9, and where the variable a is constrained between 1 and 5, the input space 505, may be fractured by the variable a, into the following 5 sub spaces 507: (1, b, c, d, e), (2, b, c, d, e), (3, b, c, d, e), (4, b, c, d, e), and (5, b, c, d, e). As those of ordinary skill in the art will appreciate, more sophisticated methods of fracturing may be used. For example, the input space 505 may be fractured based on multiple variables. Furthermore, an order of which variable is fractured on first may be selected.

Search Space Reduction Using Auxiliary Solvers

An operation 405 for selecting an unsearched one of the subspaces 507 and an operation 407a for searching the selected subspace 507 for unique input vectors 509 are provided. The test set generation module 207 shown in FIG. 5 further includes a subspace searching module 511, which is configured to search the sub spaces 507 for unique input vectors 509. Any unique input vectors 509 found during the search are then are added to the test set 213.

The method 401 further includes an operation 407b for deriving a solution to the sub space 507 selected by the operation 405, and for which the operation 407a is searching for unique input vectors. With various implementations, the operations 407a and 407b are executed simultaneously, such as, for example, by executing them on separate programmable computer systems (e.g. the programmable computer system 101 detailed above). In various implementations, the operation 407b will determine if at least a single solution to the selected subspace 507 exists. More specifically, 407b will determine if at least one input vector satisfying the coverage constraints 215 exists within the selected subspace 507.

As detailed, the operation 407a searches the selected subspace 507 for unique input vectors 509, that is, input vectors that satisfy the coverage constraints, but are not yet included in the test set 213. The operation 407b however, derives a solution to the selected subspace 507, to determine if at least one input vector, not necessarily a unique input vector 509 exists within the subspace 507. Accordingly, as stated, the test set generation module 207 includes the subspace searching module 511, which may be configured to search a sub space 507 for unique input vectors. Additionally, a subspace solver module 513 is included in the test set generation module 207. Auxiliary solvers 515 are also provided, which the subspace solver module 513 may use as resources to solve a subspace 507. With various implementations, multiple auxiliary solvers 515 may be used, sometimes simultaneously, by, for example, executing the solvers on separate computer systems. More specifically, the subspace solver module 513 may use multiple different auxiliary solvers 515 simultaneously to determine if a solution to the selected subspace 507 exists. Subsequently, whichever solver determines that a solution does not exist first will trigger the operation 409b.

Operations 409a and 409b are provided for aborting the operations 407b and 407a respectively. As can be seen, if the operation 407b determines that no solutions to the selected subspace 507 exist (i.e. that no input vectors satisfying the coverage constraints 215 exist within the subspace 507) then an operation 409b for aborting the current operation 407a is provided. If the operation 407b determines that a solution does exist, then the operation 407a is allowed to continue.

Similarly, in the event that a unique input vector 509 is found by the operation 407a, and then the currently executing operation 407b is aborted by the operation 409a and an operation 411 for continuing to search the selected subspace 507 for unique input vectors 509 is provided. Additionally, if no input vectors are found within the subspace by the operation 407a, the operation 409a may be used to abort the operation 407b. Once either the currently selected subspace 507 is searched or it is determined that there are no input vectors satisfying the coverage constraints 215, it is checked to see if any subspaces 507 still need searching. If so, then the method 401 returns to operation 405. If not, then the method 405 ends.

With some implementations of the disclosed subject matter, the methods detailed in FIG. 4, and elsewhere herein may be performed in parallel. More specifically, multiple iterations of the method 401 may be performed concurrently. Additionally, the methods detailed herein may be performed in a hierarchical fashion. More particularly, an input space (e.g., the input space 505) may be fractured at different levels, forming a hierarchy of subspaces 507. Unique input vectors within these subspaces may be identified using the techniques disclosed herein, by for example, initiating multiple instances of the method 401 using the hierarchical subspaces. As one non-limiting example, if a first subspace at one level of hierarchy and a second subspace at a lower level of hierarchy were being searched and it was determined that no solutions existed for the higher level subspace (i.e., the higher level subspace did not include any input vectors that satisfy the constraints), then the search of both the higher and lower level subspace may be aborted.

With various implementations of the disclosed technology, the auxiliary solvers 515 may adhere to a numerical solver standard, such as, for example, DIMACS or SMT-LIB. In further implementations, the auxiliary solvers 515 may be of the following types of numerical solvers, CVC3, ABSolver, CVC4, MiniSMT, Yices, or Z3. The CVC3 solver and associated technical details are addressed in greater detail in *Proceedings of the 19th International Conference on Computer Aided Verification (CAV '07)*, by Clark Barrett and Cesare Tinelli, volume 4590 of *Lecture Notes in Computer Science*, pages 298-302. Springer, July 2007. Berlin, Germany, which article is incorporated entirely herein by reference.

In various implementations the subspaces 507 may be transformed into a particular format (e.g., suitable for use by the auxiliary solvers 515), such as, for example, bit vector format. In some examples, the constraints associated with a particular subspace 507 may be translated into a corresponding set of constraints, such as, for example, in bit-vector representation. With further implementations, the set of constraints may also be simplified. With some implementations, the translator works by generating a constraint expression tree and propagating the expression tree in the post-order fashion. As shown below, constraint translation consists of (i) the Constraint Pattern Recognizer and the (ii) CVC3 Constraint Generator. The constraint pattern recognizer identifies some constraint patterns involving non-linear operators which can be converted to simpler operations. The CVC3 Constraint Generator translates theses identified sub-expressions into the simpler form. If a sub-expression cannot be simplified or is not identified by the Constraint Pattern Recognizer then the CVC3 Constraint Generator translates the original constraints without simplification.

Figure 6:
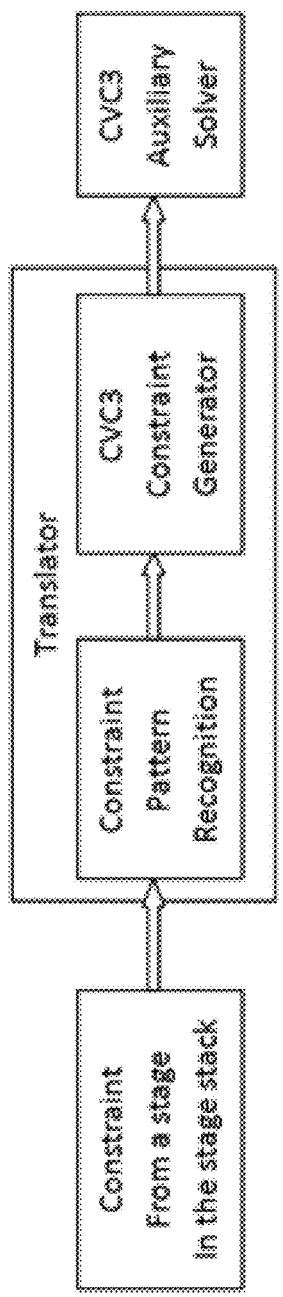
FIG. 6 illustrates a block diagram of constraint translation.

FIG. 6 illustrates a block diagram of constraint translation.

The following shows in Table 1 the patterns that are recognized by the Constraint Pattern Recognizer and the corresponding CVC3 bit vector constraints generated by the CVC3 Constraint Generator.

Patterns Recognized in the inFact Constraints and the Corresponding Bi-Vector Representation.

Variables and Domains:

A: [0 . . . 255]

Bit Vector Representation: $A_{BV} = a^7, a^6, a^5, a^4, a^3, a^2, a^1, a^0$

TABLE 1

| inFact Constraints | CVC3 Bit Vector Constraints | Comments |
|---|---|---|
| $A \% 2^n$ | $A_{BV} \& (2^n - 1)$ | Bitwise And Operantion |
| $A/2^n$ | $A_{BV} >> n$ | Arithmetic Shift right operation |
| $A * 2^n$ | $A_{BV} << n$ | Shift left operation |
| $2^n << A$ | $2^{A+n}$ | |
| $2^n >> A: A < n$ | $2^{n-A}$ | |

Consider the following constraint problem with two constraints. The values of variables $a_1$, $a_2$ and $a_3$ can be represented using 3 bits. The constraint C1 says that $a_2$ and $a_3$ can only have a single "1".

Variables and Domains:

$a_1$: [1 . . . 4]

$a_2$: [1 . . . 4]

$a_3$: [1 . . . 4]

inFact Constraints:

C1: $(a_2 \wedge (a_2-1)) V (a_3 \wedge (a_3-1)) == 0$ /* $a_2$ and $a_3$ have only one "1"*/

C2: $(a_1 \% 2) V (a_2 \% 4) V (a3 \% 8) == 7$

CVC3 Constraints:

C1: $(a_{2BV} \& (a_{2BV}-1)) | (a_{3BV} \& (a_{3BV}-1)) == 000$

C2: $(a_{1BV} \& 001) | (a_{2BV} \& 011) | (a_{3BV} \& 111) == 111$

As can be seen, the constraint C1 could not be recognized to have any specific patterns. Hence it was translated without any simplification. But for constraint C2 the mod operator is eliminated as recognized by the masking operation being done using the mod operator.

In some implementations, operation of the methods and techniques disclosed herein may be repeatable. More particularly, given the same input space 505 and coverage constraints 215, the results will be reproducible. The concept of repeatability is discussed below.

Repeatability

1. Introduction:

As indicated, various implementations of the invention may provide repeatability for a given input space and set of constraints. Accordingly, for a given random seed and a given problem the solver should generate the same solution order among multiple solver runs. Repeatability is an important consideration for testability and correctness of the solver. It is important to note that the following discussion is provided for purposes of explanation only and is not intended to be limiting.

Example 1

The following constraint problem will be used as an example for the rest of the section.
Variables and Domains:
  $a_1$: [1 . . . 4]
  $a_2$: [1 . . . 4]
  $a_3$: [1 . . . 4]
Constraints:
  C1: $(a_2 \wedge (a_2-1)) \vee (a_3 \wedge (a_3-1))==0$ /* $a_2$ and $a_3$ have only one "1"*/
  C2: $(a_1 \% 2) \vee (a_2 \% 4) \vee (a3 \% 8)==7$
Complexity:
  Total number of possible solutions: $4^3=64$
Solutions:
  $\{a_1,a_2,a_3\}=\{1,2,4\}$ and $\{3,2,4\}$ FIG. 7 illustrates a search tree for the above constraint problem example.

Figure 7:
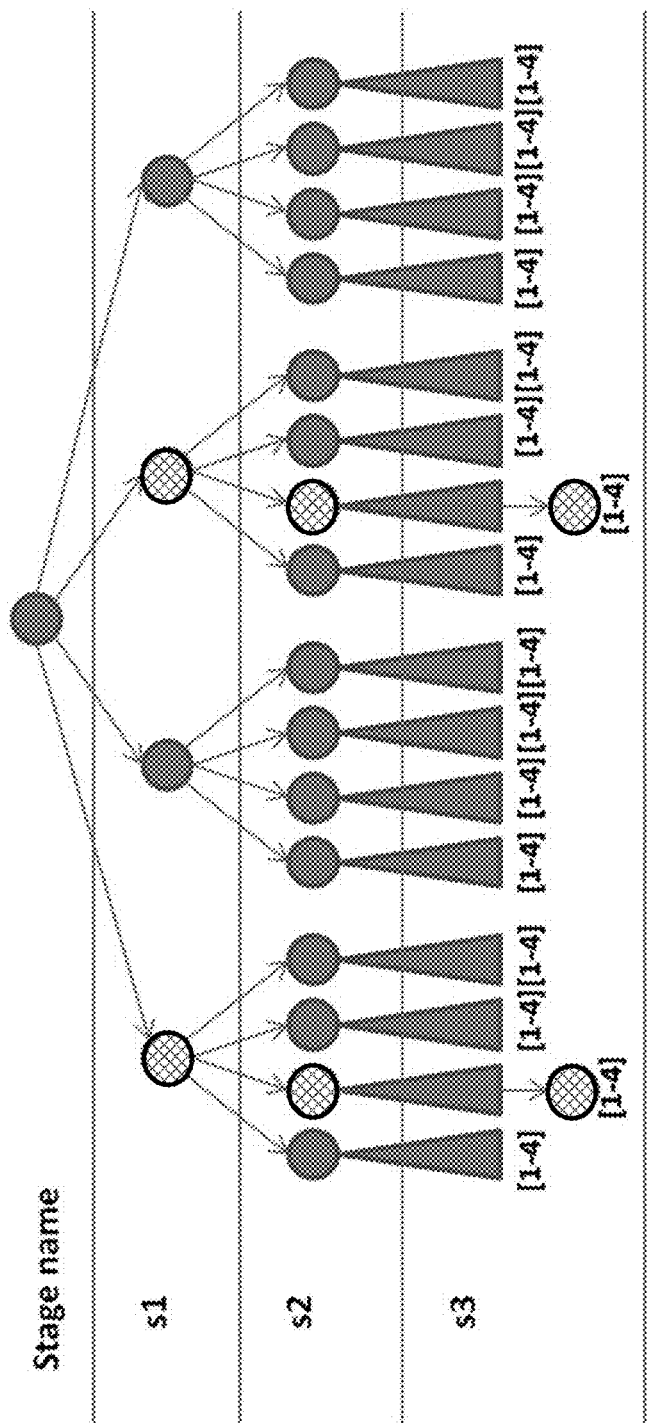
FIG. 7 illustrates a search tree for a constraint problem example.

FIG. 7 shows the search space for the above problem with the solution values shown in hatch shade. The fracturing order is $\{a_1,a_2,a_3\}$ which is done the stages $\{s_1,s_2,s_3\}$. The values next to the circles show the values assigned to the variables $\{a_1,a_2,a_3\}$. At each stage, after assigning a variable value the heuristic solver runs an optimizer to propagate the assignment to all the constraints and simplifies them. This is not shown separately in the figure and is the part of the edges coming out of the circles. The triangles at the bottom represent all the values of $a_3$ which are searched in the stage $s_3$. The node on the top denoted by "r" is the root node. We will use the following notation:

$\{a_1,a_2,a_3\}$: This represents the values of $a_1$, $a_2$ and $a_3$ which are being assigned at various stages $\{s_1,s_2,s_3\}$. For example $\{2,3,1\}$ means that in stage $s_1$ value of $a_1=2$, in stage $s_2$ value of $a_2=3$ and in stage $s_3$ value of $a_3=1$.

$\{a_1,-,-\}$: This means that the value of $a_1$ is assigned in stage $s_1$ but $a_2$ and $a_3$ are unassigned.

$\{a_1,a_2,\Delta\}$: This means that we have assigned the values of $a_1$ and $a_2$ in stages $s_1$ and $s_2$ and we are searching for all the values of $a_3$ in the stage $s_3$. Similarly, we can have $\{a_1,\Delta,\Delta\}$ or $\{\Delta,\Delta,\Delta\}$.

$\{a_1,a_2,\Lambda\}$: This represents the condition where we have assigned the values of $a_1$ and $a_2$ in the stages $s_1$ and $s_2$, but we will not end up searching all the values of $a_3$ in stage $s_3$ because the auxiliary solve returned that no solution exists in the search space $\{a_1,a_2,\Delta\}$.

$\{a_1,\Lambda,X\}$: This implies that, we will skip all the values of $a_3$ and the remaining values of $a_2$.

Figure 8:
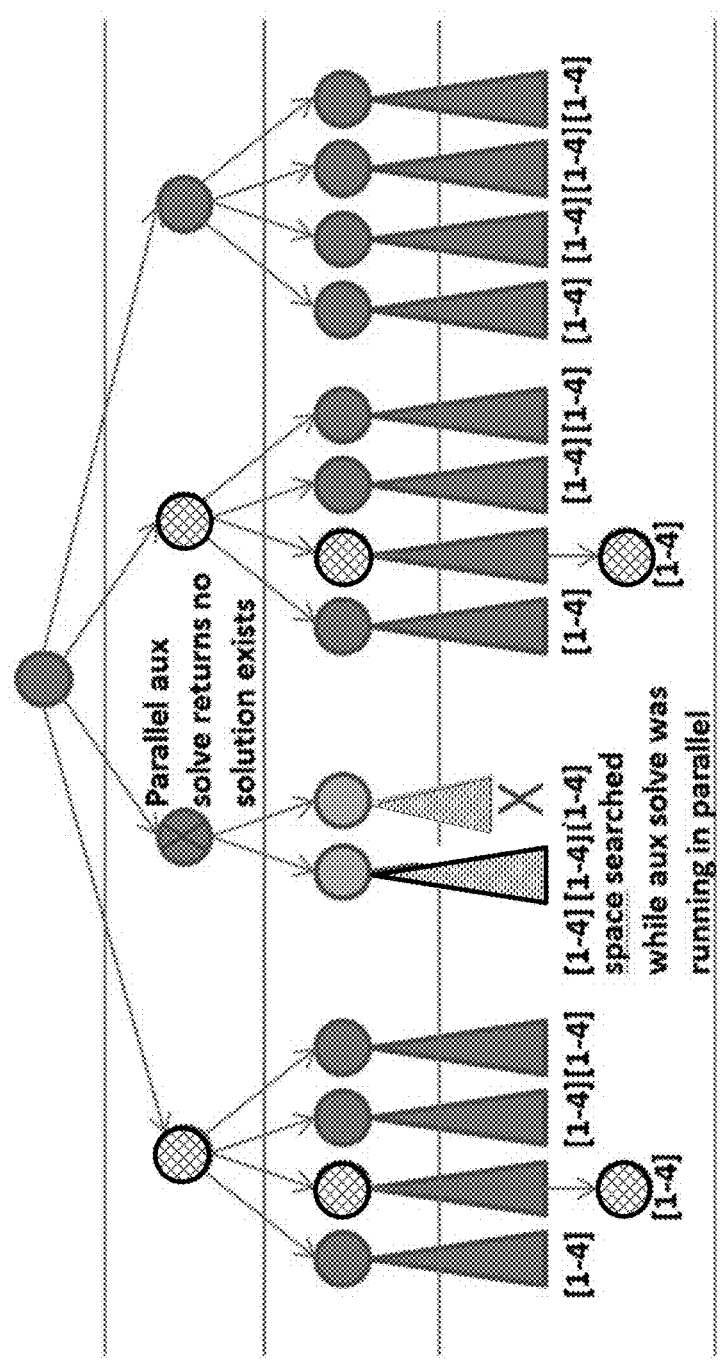
FIG. 8 illustrates a search tree for a constraint problem example.

FIG. 8 illustrates a search tree for the above constraint problem example

FIG. 8 shows the scenario where an auxiliary solver is launched in the stage $s_2$ for the value of $a_1=2$ ($\{2,-,-\}$). While the auxiliary is running, the heuristic solver continues Searching for $\{2,2,\Delta\}$ as shown by the dotted longer triangle with a border. The auxiliary solver returns with a no-solution exists, when the heuristic solver is in $\{2,3,\Delta\}$ as shown by the "X" over circle 2 in the $s_1$ level. The heuristic solver aborts the search, pops the stage stack and continues searching for another value in stage $s_1$.

2. Problem Definition

In order to obtain repeatability of solution order in the constraint solutions, constraint random solver employs a pseudo random number generator in order to assign a variable value at each stage of the search tree. The order of search progression depends on the random number sequence. A pseudo random number generator produces a unique sequence for a given seed parameter. For a given fracturing order of the solution space, the solution order is unique to the random number seed. The order of search progression is unique to a given pseudo random number sequence in case the search space is static. Table 2 shows the search space progression for a given pseudo-random sequence for the constraint problem in Example 1.

TABLE 2

Search space progression for a given pseudo random number sequence

| pseudo-random sequence 1 | Search progression | Comments |
|---|---|---|
| 1 | {1, —, —} | Push stage stack |
| 4 | {1, 4, —} | Push stage stack |
| 2 | {1, 4, 2} | Push stage stack |
| 1 | {1, 4, 1} | |
| 2 | {1, 4, 2} | |
| 4 | {1, 4, 4} | |
| 3 | {1, 4, 3} | Pop Stack |
| 2 | {1, 2, —} | Push Stack |
| 4 | {1, 2, 4} | Solution Found |

The use of an auxiliary solver sub-system used to improve the performance of constraint solution speeds up the search progression of the heuristic solver by indicating whether a solution exists in a given sub-space or not. Consequently, the heuristic does not search the sub-space if an auxiliary solve indicated that there was no solution. As the use of auxiliary solves changes the search progression, it puts the following requirements on repeatability. This requirement says that the final solution set and the solve order is independent of the following scenarios:

a. Enabled or disabling the auxiliary solve mechanism: The final solution should not be affected by the search space pruning when the auxiliary solver mechanism is activated.

b. The timing of the results returned from the auxiliary solves: As the auxiliary solves are invoked as separate processes, the system should be tolerant of the non-determinism of the solve execution time.

In the previous implementation activating the auxiliary solve mechanism breaks repeatability due to the fact that the future order of search progression was dependent on the current search space pruning decisions. This is because it reused the same pseudo random number generator across stages without initializing it with a new seed value. This is a problem when the auxiliary solve mechanism asynchronously eliminates a sub-space without progressing the pseudo random number generator by the corresponding amount, hence affecting the solution order. Table 3 shows this scenario where we see the effect on the search space progression when auxiliary solve mechanism is activated for the Example 1 above. An auxiliary solve starts in the third row in $\{1,4,-\}$. It returns with a solution not found when in $\{1,4,2\}$. This causes it to abort search for the space $\{1,4,\Delta\}$. Now instead of searching for space $\{1,2,-\}$ it searches for $\{1,1,-\}$ because the next random number generated is "1" instead of a "2".

TABLE 3

Effect on search space progression due to auxiliary solves

| pseudo-random sequence | Without Auxiliary Solve Mechanism | | With Auxiliary Solve Mechanism | |
|---|---|---|---|---|
| | Search progression | Comments | Search progression | Comments |
| — | {—, —, —} | Push stage stack | {—, —, —} | Push stage stack |

TABLE 3-continued

Effect on search space progression due to auxiliary solves

| pseudo-random sequence | Without Auxiliary Solve Mechanism | | With Auxiliary Solve Mechanism | |
|---|---|---|---|---|
| | Search progression | Comments | Search progression | Comments |
| 1 | {1, —, —} | Push stage stack | {1, —, —} | Push stage stack |
| 4 | {1, 4, —} | Push stage stack | {1, 4, —} | Push stage stack and launch auxiliary solve |
| 2 | {1, 4, 2} | | {1, 4, 2} | Aux. solve returned Solution not found so pop stage stack |
| 1 | {1, 4, 1} | | {1, 1, —} | Push Stage stack |
| 2 | {1, 4, 2} | | {1, 1, 2} | |
| 4 | {1, 4, 4} | | {1, 1, 4} | |
| 3 | {1, 4, 3} | Pop Stack | {1, 1, 3} | |
| 2 | {1, 2, —} | Push Stack | {1, 1, 2} | |
| 4 | {1, 2, 4} | Solution Found | {1, 1, 4} | |

The non-determinism of auxiliary solves can also effect the solution order. The auxiliary solver is started in a separate process in parallel while the heuristic solver is searching in the current sub-space. Consequently, the time it takes for the auxiliary solver to solve a given problem depends on how the process is scheduled by the operating system. If the auxiliary solve returns with no-solution exists in a given sub-space before the heuristic solver finishes, then the heuristic solver stops searching in the given sub-space and starts searching in a next sub-space. The next random number in the sequence determines the next sub-space to be searched. For a solver run, with the auxiliary solve mechanism deactivated, the heuristic solver will finish searching within the current sub-space where no-solution exists. At this time the pseudo-random number generator may return a different value hence selecting a sub-space different from the one selected when the auxiliary solver mechanism is activated. This can be seen in the Table 4 below which compares the search progression of two cases of auxiliary solve mechanism where the auxiliary solver finishes at different times.

TABLE 4

Search space progression when auxiliary solves finishes at different times

| pseudo-random sequence | Case1: With Auxiliary Solve Mechanism | | Case2: With Auxiliary Solve Mechanism | |
|---|---|---|---|---|
| | Search progression | Comments | Search progression | Comments |
| — | {—, —, —} | Push stage stack | {—, —, —} | Push stage stack |
| 1 | {1, —, —} | Push stage stack | {1, —, —} | Push stage stack |
| 4 | {1, 4, —} | Push stage stack and launch auxiliary solve | {1, 4, —} | Push stage stack and launch auxiliary solve |
| 2 | {1, 4, 2} | Aux. solve returned Solution not found so pop stage stack | {1, 4, 2} | |
| 1 | {1, 1, —} | Push Stage stack | {1, 4, 1} | Aux. solve returned Solution not found so pop stage stack |
| 2 | {1, 1, 2} | | {1, 2, —} | Push stage stack |
| 4 | {1, 1, 4} | | {1, 2, 4} | Solution Found |
| 3 | {1, 1, 3} | | {1, 2, 3} | |
| 2 | {1, 1, 2} | | {1, 2, 2} | |
| 4 | {1, 1, 4} | | {1, 2, 4} | |

3. Solution

In order to make the solve order independent of non-determinism and search space pruning done by the auxiliary solve mechanism, we use separate pseudo-random number generators for each stage. These generators are initialized by a seed which is passed on by the previous stage and is based on the value to which a variable is assigned in the previous stage. Consider the following Table 5, which shows the random sequence generated at the level $s_i$ based on the branch take in the level $s_{i-1}$. As a result of this, the random number sequence at $s_{i-1}$ does not get effected by the fact that the auxiliary solve mechanism might be pruning out the solution space at the stage $s_i$ without searching it completely.

TABLE 5

Random number sequence at $s_i$ when a branch is taken at $s_{i-1}$

| Brach at $s_{i-1}$ | Random sequence at $s_i$ |
|---|---|
| $a_i$ = 1 | {1, 2, 4, 3} |
| 2 | {2, 3, 1, 2} |
| 3 | {1, 3, 4, 2} |
| 4 | {4, 1, 2, 3} |

This enables us to launch auxiliary solves at any stage without causing problems with the solution ordering. This is shown in Table 6, which compares the sequence of operations involved in launching jobs at various stages of the search. In Case1 we are always launching jobs in the stage $s_1$ while in Case2 we are doing the same for the stage $s_2$. The random number generators at various stages initialized based on Table 5. It also shows the solve progression when the auxiliary solve mechanism is deactivated (Column 1). It can be seen that the solution order remains the same. Moreover, in Case1 even when the Job2 takes longer time than usual to return a solution, the solution order does not change.

TABLE 6

Solve progression comparison when jobs are launched at stage $s_1$ and stage $s_2$

| Without Aux solve | Case1: With Aux being launched at stage $s_1$ | | Case2: With Aux being launched at stage $s_2$ | |
|---|---|---|---|---|
| Solve Progression | Solve Progression | Aux Solve Result | Solve Progression | Aux Solve Result |
| {4, 4, Λ} | {4, Λ, X} | Job1: No solution exists | {4, 4, Λ} | Job1: No solution exists |
| {4, 1, Λ} | — | — | {4, 1, Λ} | Job2: No solution exists |
| {4, 2, Λ} | | — | {4, 2, Λ} | Job3: No solution exists |
| {4, 3, Λ} | | — | {4, 3, Λ} | Job4: No solution exists |
| {2, 2, Λ} | {2, 2, Λ} | Job2: No solution exists | {2, 2, Λ} | Job5: No solution exists |
| {2, 3, Λ} | {2, 3, Λ} | | {2, 3, Λ} | Job6: No solution exists |
| {2, 1, Λ} | {2, X, X} | — | {2, 1, Λ} | Job7: No solution exists |
| {2, 2, Λ} | | — | {2, 2, Λ} | Job8: No solution exists |
| {3, 1, Λ} | {3, 1, Λ} | Job3: At least one solution exists | {3, 1, Λ} | Job9: No solution exists |
| {3, 3, Λ} | {3, 3, Λ} | — | {3, 3, Λ} | Job10: No solution exists |
| {3, 4, Λ} | {3, 4, Λ} | — | {3, 4, Λ} | Job11: No solution exists |
| {3, 2, Λ} | {3, 2, Λ} | — | {3, 2, Λ} | Job12: At least one solution exists |
| {1, 1, Λ} | {1, 1, Λ} | Job4: A solution exists | {1, 1, Λ}} | Job13: No solution exists |
| {1, 2, Λ} | {1, 2, Λ} | — | {1, 2, Λ} | Job14: At least one solution exists |
| {1, 4, Λ} | {1, 4, Λ} | — | {1, 4, Λ} | Job15: No solution exists |
| {1, 3, Λ} | {1, 3, Λ} | — | {1, 3, Λ} | Job16: No solution exists |

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

The invention claimed is:

1. A method comprising:
   executing, by a computer system, a first process that performs a solving operation to determine if any input vector within a set of input vectors satisfy an input constraint;
   executing, by the computer system, in parallel with execution of the first process, a second process that performs a searching operation to search for unique input vectors that satisfy the input constraint;
   aborting the solving operation on the set based on a determination that at least one unique input vector has been found by the searching operation to satisfy the input constraint; and
   applying, as part of a process for verifying an electronic circuit design of an electronic circuit that is to be fabricated or manufactured, the at least one unique input vector to the electronic circuit design.

2. The method of claim 1, wherein the set forms a first subspace of an input space for the electronic circuit design and an additional set of input vectors forms a second subspace of the input space, and wherein the method further comprises:
   performing the solving operation on the additional set; and
   performing, while performing the solving operation on the additional set, the searching operation on the additional set for additional unique input vectors that satisfy the input constraint based on a determination by the solving operation that at least one input vector within the additional set satisfies the input constraint.

3. The method of claim 1, wherein the set forms a first subspace of an input space for the electronic circuit design and an additional set of input vectors forms a second subspace of the input space, and wherein the method further comprises:
   performing the searching operation on the additional set for additional unique input vectors that satisfy the input constraint;
   performing, while performing the searching operation on the additional set, the solving operation on the additional set; and
   aborting the solving operation on the additional set based on a determination that the search of the additional set has found at least one input vector within the additional set that satisfies the input constraint.

4. The method of claim 1, wherein the set forms at least a portion of an input space for the electronic circuit design.

5. The method of claim 4, wherein the input constraint comprises coverage constraints of a coverage model of the electronic circuit design.

6. The method of claim 4, wherein the electronic circuit design is a microcircuit design of a microcircuit that is to be fabricated or manufactured.

7. The method of claim 1, wherein the set forms a first subspace of an input space for the electronic circuit design and an additional set of input vectors forms a second subspace of the input space, and wherein the method further comprises:
   performing the solving operation on the additional set;
   performing, while performing the solving operation on the additional set, the searching operation on the additional set for additional unique input vectors that satisfy the input constraint; and
   aborting the searching operation on the additional set in response to a determination by the solving operation that no input vector within the additional set satisfies the input constraint, wherein after aborting the searching operation on the additional set, a portion of the additional set is unsearched by the searching operation.

8. One or more computer readable memory devices comprising computer executable instructions, that when executed by one or more computers, cause the one or more computers to:
- execute a first process that performs a solving operation to determine if any input vector within a set of input vectors satisfy an input constraint;
- execute, in parallel with execution of the first process, a second process that performs a searching operation to search for unique input vectors that satisfy the input constraint;
- abort the solving operation on the set based on a determination that at least one unique input vector has been found by the searching operation to satisfy the input constraint; and
- apply, as part of a process for verifying an electronic circuit design of an electronic circuit that is to be fabricated or manufactured, the at least one unique input vector to the electronic circuit design.

9. The one or more computer readable memory devices of claim 8, wherein the set forms a first subspace of an input space for the electronic circuit design and an additional set of input vectors forms a second subspace of the input space, and wherein computer executable instructions, when executed by one or more computers, cause the one or more computers to:
- perform the solving operation on the additional set; and
- perform, while performing the solving operation on the additional set, the searching operation on the additional set for additional unique input vectors that satisfy the input constraint based on a determination by the solving operation that at least one input vector within the additional set satisfies the input constraint.

10. The one or more computer readable memory devices of claim 8, wherein the set forms a first subspace of an input space for the electronic circuit design and an additional set of input vectors forms a second subspace of the input space, and wherein computer executable instructions, when executed by the one or more computers, cause the one or more computers to:
- perform the searching operation on the additional set for unique second input vectors that satisfy the input constraint;
- perform, while performing the searching operation on the additional set, the solving operation on the additional set; and
- abort the solving operation on the additional set based on a determination that the searching operation on the additional set has found at least one input vector within the additional set that satisfies the input constraint.

11. The one or more computer readable memory devices of claim 8, wherein the set forms at least a portion of an input space for the electronic circuit design.

12. The one or more computer readable memory devices of claim 11, wherein the input constraint comprises coverage constraints of a coverage model of the electronic circuit design.

13. The one or more computer readable memory devices of claim 11, wherein the electronic circuit design is a microcircuit design of a microcircuit that is to be fabricated or manufactured.

14. The one or more computer readable memory devices of claim 8, wherein the set forms a first subspace of an input space for the electronic circuit design and an additional set of input vectors forms a second subspace of the input space, and wherein the computer executable instructions, when executed by the one or more computers, cause the one or more computers to:
- perform the solving operation on the additional set;
- perform, while performing the solving operation on the additional set, the searching operation on the additional set for additional unique input vectors that satisfy the input construct; and
- abort the searching operation on the additional set in response to a determination by the solving operation that no input vector within the additional set satisfies the input constraint, wherein after the searching operation on the additional set is aborted, a portion of the additional set is unsearched by the searching operation.

15. An apparatus comprising:
one or more processors; and
one or memory storing executable instructions, that when executed by one or more processors, cause the apparatus to:
- execute a first process that performs a solving operation to determine if any input vector within a set of input vectors satisfy an input constraint;
- execute, in parallel with execution of the first process, a second process that performs a searching operation to search for unique input vectors that satisfy the input constraint;
- abort the solving operation on the set based on a determination that at least one unique vector has been found by the searching operation on the set to satisfy the input constraint; and
- apply, as part of a process of verifying an electronic circuit design of an electronic circuit that is to be fabricated or manufactured, the at least one unique input vector to the electronic circuit design.

16. The apparatus of claim 15, wherein the set forms a first subspace of an input space for the electronic design and an additional set of input vectors forms a second subspace of the input space, and wherein the executable instructions, when executed by the one or more processors, cause the apparatus to:
- perform the solving operation on the additional set; and
- perform, while performing the solving operation on the additional set, for additional unique input vectors that satisfy the input constraint based on a determination by the solving operation on the additional set that at least one input vector within the additional set satisfies the input constraint.

17. The apparatus of claim 15, wherein the set forms at least a portion of an input space for the electronic circuit design.

18. The apparatus of claim 17, wherein the input constraint comprises coverage constraints of a coverage model of the electronic circuit design.

19. The apparatus of claim 17, wherein the electronic circuit design is a microcircuit design of a microcircuit that is to be fabricated or manufactured.

20. The apparatus of claim 15, wherein the set forms a first subspace of an input space for an electronic circuit design and an additional set of input vectors forms a second subspace of the input space, and wherein the executable instructions, when executed by the one or more processors, cause the apparatus to:
- perform the solving operation on the additional set;
- perform, while performing the solving operation, on the additional set, the searching operation on the additional set for additional unique input vectors that satisfy the input constraint; and abort the searching operation on the additional set in response to a determination by the solving operation that no input vector within the additional set satisfies the input constraint, wherein after the searching operation on the additional set is aborted, a portion of the additional set is unsearched by the searching operation.

* * * * *